United States Patent
Simmons et al.

(10) Patent No.: US 8,138,844 B1
(45) Date of Patent: Mar. 20, 2012

(54) SYSTEM AND METHOD FOR CRYSTAL OSCILLATOR FREQUENCY TUNING

(75) Inventors: John Simmons, Tamarac, FL (US); Kristopher Kaufman, Gilbert, AZ (US)

(73) Assignee: Fujitsu Semiconductor Limited, Kanagawa (JP)

( * ) Notice: Subject to any disclaimer, the term of this patent is extended or adjusted under 35 U.S.C. 154(b) by 0 days.

(21) Appl. No.: 12/879,525

(22) Filed: Sep. 10, 2010

(51) Int. Cl.
*H03B 5/32* (2006.01)

(52) U.S. Cl. .................. 331/116 R; 331/179

(58) Field of Classification Search .......... 331/116 R, 331/116 FE, 158, 36 C, 177 V, 179, 117 R, 331/117 FE, 167

See application file for complete search history.

(56) References Cited

U.S. PATENT DOCUMENTS

| | | | |
|---|---|---|---|
| 6,400,231 B1 * | 6/2002 | Leduc et al. | 331/116 FE |
| 6,606,004 B2 | 8/2003 | Staszewski et al. | 331/17 |
| 7,532,079 B2 * | 5/2009 | Shen et al. | 331/116 FE |
| 2007/0222527 A1 | 9/2007 | Pretl | 331/34 |

* cited by examiner

*Primary Examiner* — Ryan Johnson
(74) *Attorney, Agent, or Firm* — Baker Botts L.L.P.

(57) ABSTRACT

An oscillator may include a crystal resonator, an inverter coupled in parallel with the crystal resonator, a first switched capacitor coupled to a first terminal of the crystal resonator, a second switched capacitor coupled to a second terminal of the crystal resonator, a control module configured to output a periodic dithering signal, the periodic dithering signal having a first pulse width based on a desired frequency of oscillation for the oscillator, and a delay module configured to communicate a first periodic enable signal to enable the first switched capacitor and a second periodic enable signal to enable the second switched capacitor. At least one of the first periodic enable signal and the second periodic enable signal may have a second pulse width greater than the first pulse width. The second periodic enable signal may be phase delayed relative to the first periodic enable signal by a non-zero delay.

18 Claims, 5 Drawing Sheets

SYSTEM AND METHOD FOR CRYSTAL OSCILLATOR FREQUENCY TUNING

TECHNICAL FIELD

The present disclosure relates generally to wireless communication and, more particularly, to frequency tuning oscillator circuits of wireless communication devices.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Transmitters, receivers, and transceivers often include components known as oscillators. An oscillator may serve many functions in a transmitter, receiver, and/or transceiver, including generating a local oscillator signal (usually in a radio-frequency range) for upconverting baseband signals onto a radio-frequency (RF) carrier and performing modulation for transmission of signals, and/or for downconverting RF signals to baseband signals and performing demodulation of received signals.

In many instances, oscillators must be finely tuned to a specific frequency in order for their associated transmitters, receivers, or transceivers to function as desired.

Figure 5:
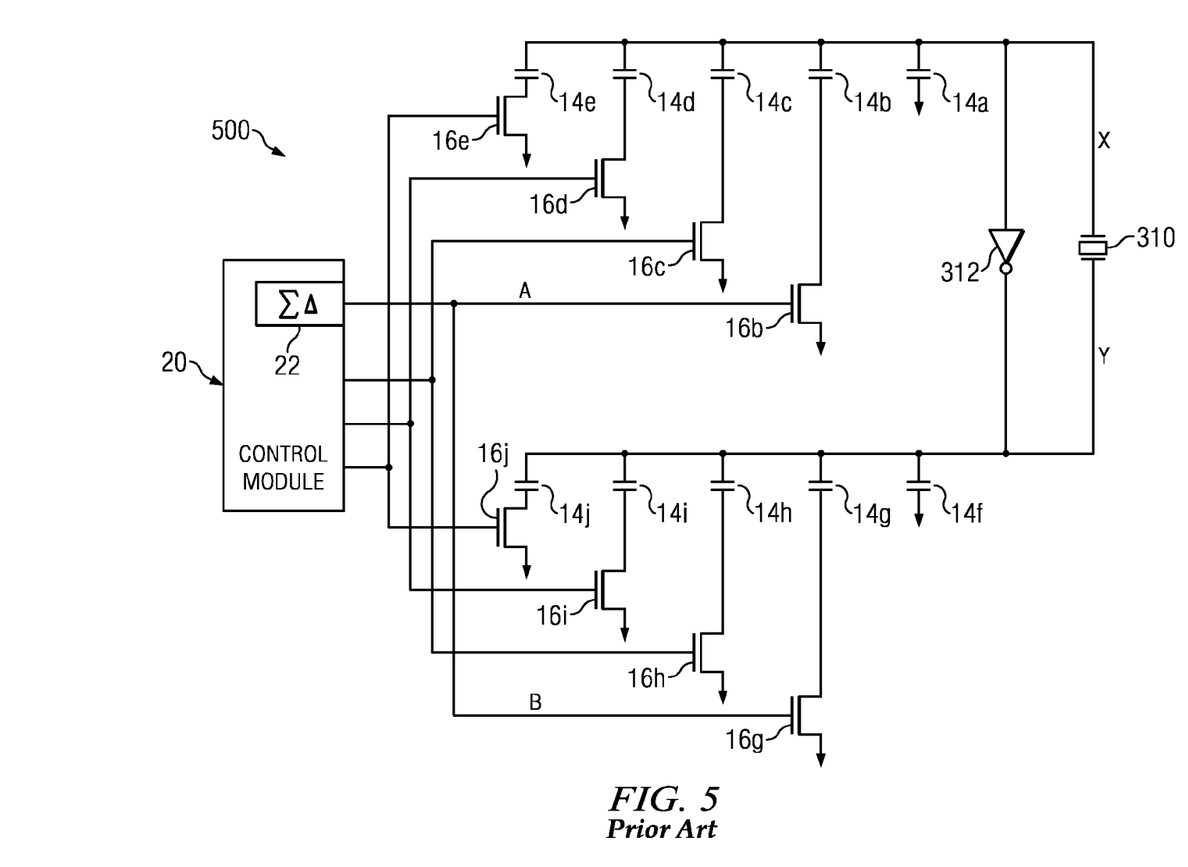
FIG. 5 illustrates an example oscillator, as is known in the art.

To achieve such fine tuning, transmitters, receivers, or transceivers often employ digitally-controlled oscillators. An example digitally-controlled Pierce oscillator 500, as known in the art, is depicted in FIG. 5. As shown in FIG. 5, oscillator 500 may include a crystal resonator 10 in parallel with an inverter 12. During operation, inverter 12 may be biased in its linear region, thus allowing it to operate as a high gain inverting amplifier. Each terminal of crystal resonator 10 may also be coupled to a plurality of capacitances. For example, capacitors 14a-14e may be coupled to node X of crystal resonator 10 (thus forming one "capacitor bank" of oscillator 500), and capacitors 14f-14j may be coupled to node Y of crystal resonator 10 (thus forming the other "capacitor bank" of oscillator 500). In many instances, the capacitor banks of oscillator 500 may be substantially identical (e.g., capacitors 14a and 14f may be substantially identical, capacitors 14b and 14g may be substantially identical, capacitors 14c and 14h may be substantially identical, capacitors 14d and 14i may be substantially identical, and capacitors 14e and 14j may be substantially identical).

In each capacitor bank of oscillator 500, one or more capacitors 14 (e.g., capacitors 14a and 14f) may be coupled to a ground voltage, while others (e.g., capacitors 14b-14e and 14g-14j) are switched capacitors coupled to a corresponding transistor 16 such that the non-gate terminals of the corresponding transistor 16 are respectively coupled to the corresponding capacitor 14 and a ground voltage. Each such transistor 16 may act a switch, either effectively coupling its corresponding switched capacitor 14 to ground voltage (enabling such capacitor 14), or leaving one terminal of its corresponding switched capacitor 14 floating (disabling such capacitor 14), depending on the voltage applied to the gate terminal of such transistor 16 (e.g., a "high" voltage applied to the gate terminal of transistor 16b will close the switch of transistor 16b providing a path to ground for a terminal of capacitor 14b, while a "low" voltage applied to the gate terminal of transistor 16b will open the switch of transistor 16b leaving a terminal of capacitor 14b floating). Because capacitors 14a and 14f are not switched capacitors 14, capacitors 14a and 14f may be considered as always enabled. Those of skill in the art will appreciate that the frequency of oscillation of oscillator 500 (e.g., the signal waveform characteristic seen at either of nodes X or Y) will be a function of the sum of the capacitances of the capacitors 14 that are provided a path to ground (e.g., those capacitors 14, including capacitors 14a and 14f, that are enabled). Thus, by switching transistors 16b-16e and 16g-16j, the effective capacitances of the capacitor banks may be modified, thus allowing tuning of the frequency of oscillation of oscillator 500.

As depicted in FIG. 5, the gate terminal of each transistor 16 may be coupled to a control module 20. Control module 20 may be configured to, based on a desired frequency of oscillation for oscillator 500, selectively enable one or more of capacitors 14b-14e and 14g-14j in order to achieve an effective capacitance that allows oscillation at the desired frequency. In many instances, capacitors 14 will be enabled such that the effective capacitance of each capacitor bank is approximately equal.

To permit finer granularity in the switched effective capacitance, and thus finer granularity in the oscillation frequency, one or more of the switched capacitors 14 may be regularly enabled and disabled, in a process called dithering. With dithering, certain capacitors 14 (e.g., capacitors 14b and 14g) may be enabled a certain percentage of the time, and disabled otherwise. The effective capacitance of such dithered capacitance 14 is approximately equal to the capacitance of the dithered capacitor times the percentage of time the dithered capacitor 14 is enabled. To provide for periodicity in the enabling and disabling of dithered capacitors 14, the switching transistors 16 (e.g., transistors 16b and 16g) associated with the dithered capacitors 14 may be coupled to a delta-sigma modulator 22 of the control module 20. Based on a desired frequency of oscillation for oscillator 500, delta-sigma modulator 22 may produce a periodic signal with a duty cycle appropriate to enable dithered capacitors 14 for a certain percentage of time, and disabled the dithered capacitors 14 otherwise.

As noted above, oscillator designs often attempt to match the effective capacitance of one capacitor bank to the other capacitor bank. Such matching allows for an oscillation signal on node X and/or node Y to have an approximate 50% duty cycle. It is often desired to also match the effective capacitance when dithering. Accordingly, in traditional approaches, the dithered capacitors 14 in each capacitor bank are enabled and disabled approximately in unison, which is shown in FIG. 5 where the gate terminal of transistor 16b (node A) and gate terminal of transistor 16g (node B) are both coupled to the output of delta-sigma modulator 22. However, such matching of enable signals for switching transistors 16 of dithered capacitors 14 may have undesirable effects. One such undesirable effect is depicted in FIG. 6.

Figure 6:
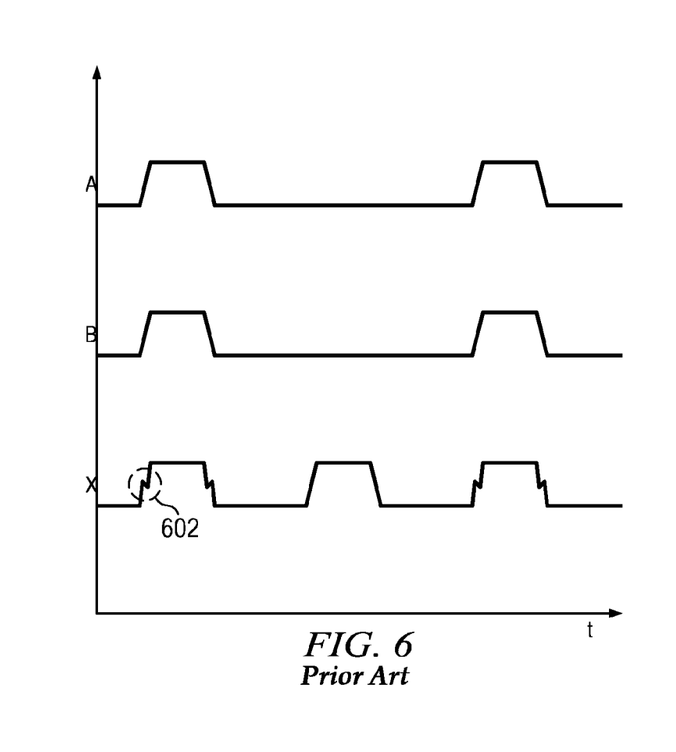
FIG. 6 illustrates a graph of example waveforms over time for selected signals at nodes of the oscillator depicted in FIG. 5.

FIG. 6 is a graph showing example signal waveforms for nodes A, B, and X of oscillator 500 depicted in FIG. 5. As shown, signals at nodes A and B may transition approximately in unison. However, the substantially contemporaneous rising and falling edges of such signals may induce glitch 602 into node X, the output of oscillator 500, especially where non-ideal conditions in oscillator 500 cause enable signals on nodes A and B to be slightly out of phase with one another. Because the output of oscillator 500 governs the modulation and demodulation of wireless transmissions in a transmitter, receiver, and/or transceiver, such high-frequency glitch 602 may cause undesired effects.

SUMMARY

In accordance with some embodiments of the present disclosure, an oscillator may include a crystal resonator, an inverter coupled in parallel with the crystal resonator, a first switched capacitor coupled to a first terminal of the crystal resonator, a second switched capacitor coupled to a second terminal of the crystal resonator, a control module configured to output a periodic dithering signal, the periodic dithering signal having a first pulse width based on a desired frequency of oscillation for the oscillator, and a delay module configured to communicate a first periodic enable signal to enable the first switched capacitor and a second periodic enable signal to enable the second switched capacitor. At least one of the first periodic enable signal and the second periodic enable signal may have a second pulse width greater than the first pulse width. The second periodic enable signal may be phase delayed relative to the first periodic enable signal by a non-zero delay.

Technical advantages of one or more embodiments of the present disclosure may include a mechanism for fine-tuning an oscillator frequency by dithering while eliminating or reducing the occurrence of high-frequency glitches on the oscillator output.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
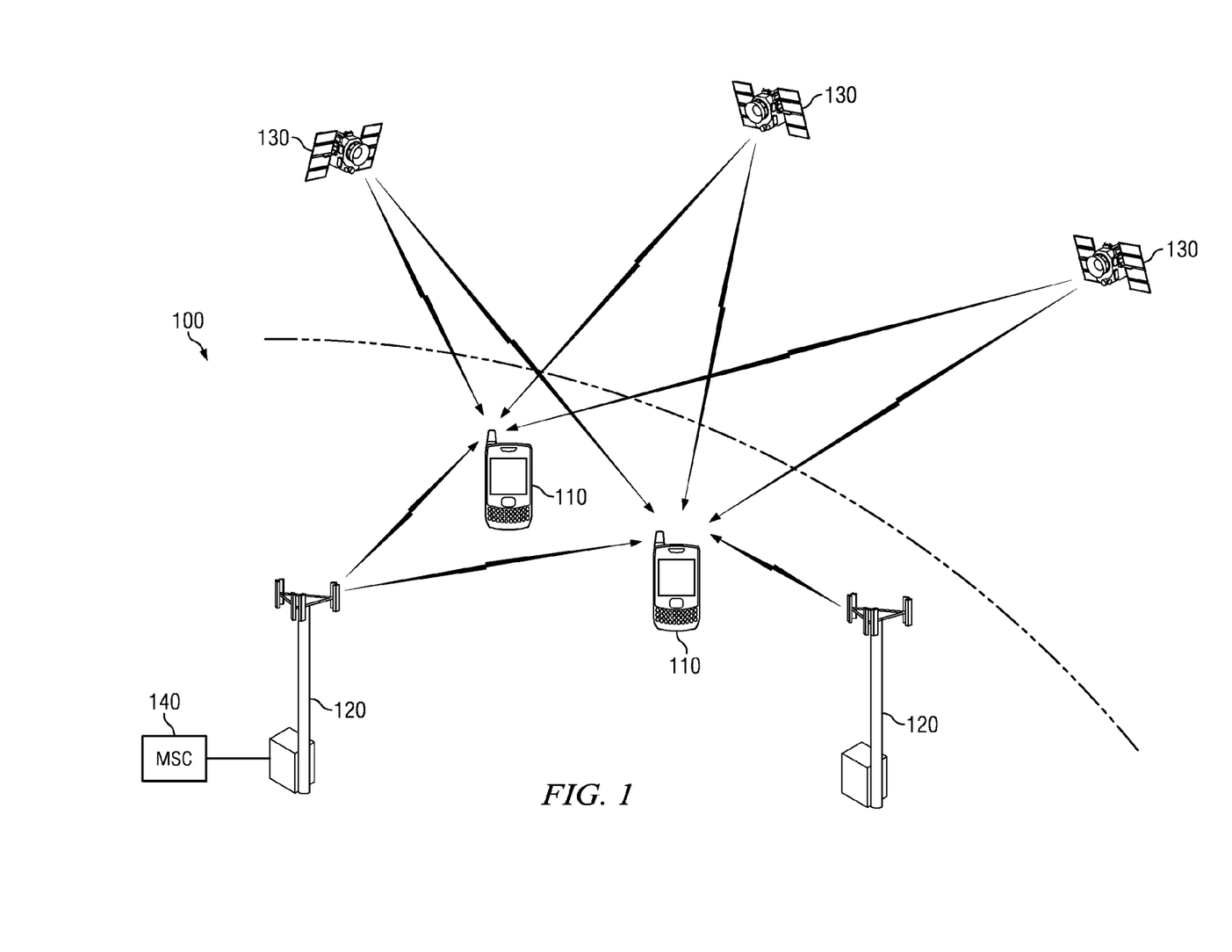
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
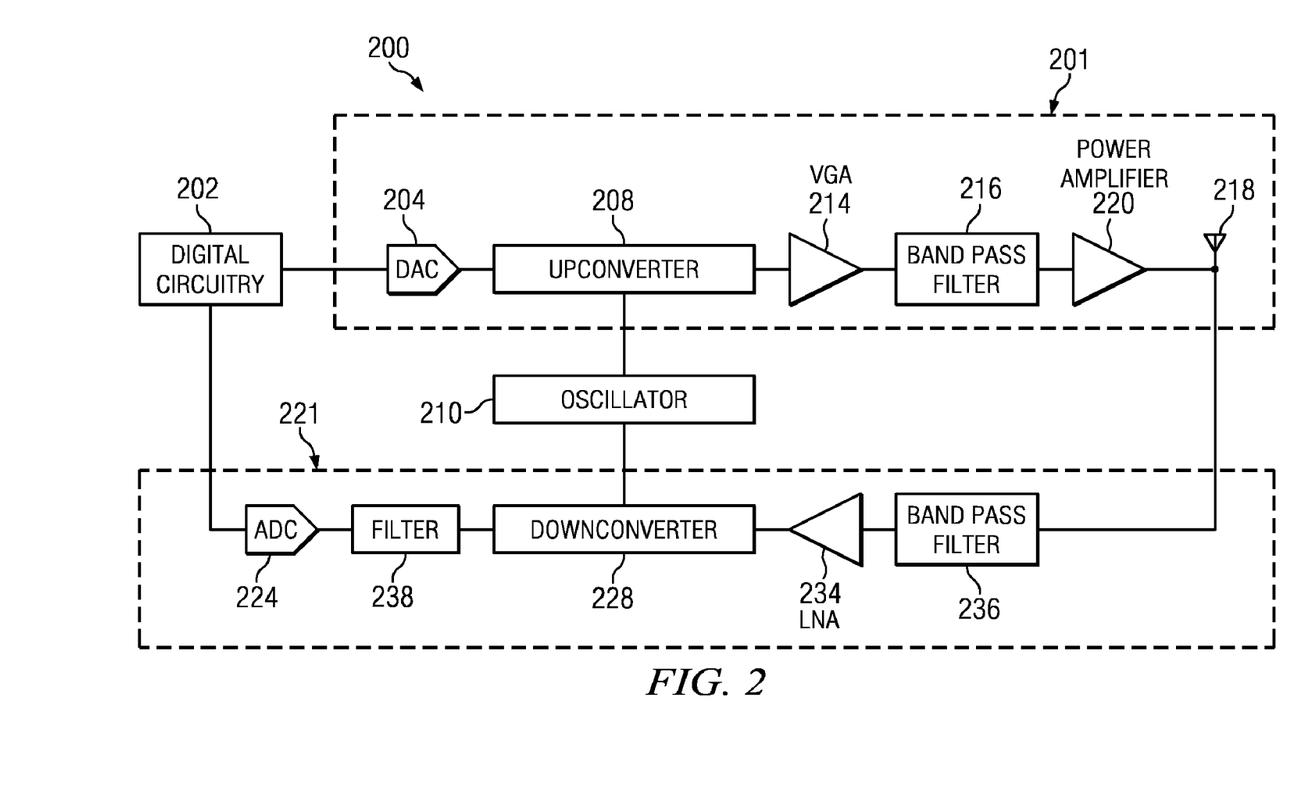
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator. Oscillator 210 may be described in greater detail below with reference to FIG. 3.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

Figure 3:
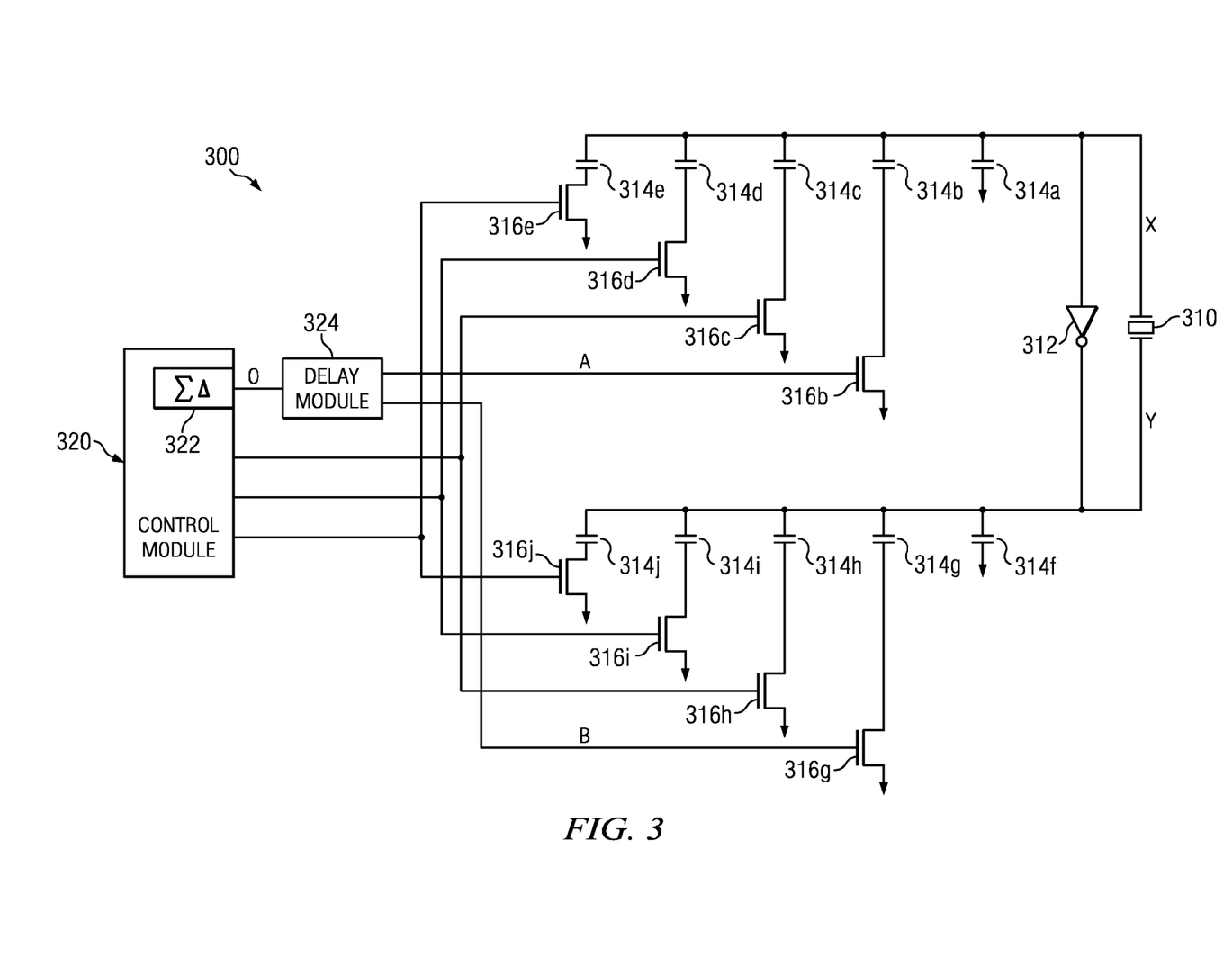
FIG. 3 illustrates a block diagram of an example oscillator, in accordance with certain embodiments of the present disclosure.

FIG. 3 illustrates a block diagram of certain embodiments of oscillator 210, in accordance with certain embodiments of the present disclosure. As shown in FIG. 3, oscillator 300 may include a resonator 310 in parallel with an inverter 312. Resonator 310 may include any piezoelectric material (e.g., a quartz crystal) with a mechanical resonance that may, in conjunction with other components of oscillator 300, create an electrical signal with a highly-precise frequency.

Inverter 312 may include any system, device or apparatus configured to invert a digital signal driven on its input. For example, if inverter 312 receives a low voltage (e.g., logic 0) driven on its input, it may drive a high voltage (e.g., logic 1) on its output. Alternatively, if inverter 312 receives a high voltage (e.g., logic 1) driven on its input, it may drive a low voltage (e.g., logic 0) on its output. Inverter 312 may be implemented as a PMOS inverter, NMOS inverter, static CMOS inverter, saturated-load digital inverter, or any other suitable implementation. However, during operation, inverter 312 may be biased in its linear region, thus allowing it to operate as a high gain inverting amplifier.

Each terminal of crystal resonator 310 may also be coupled to a plurality of capacitors 314. For example, capacitors 314a-314e may be coupled to node X of crystal resonator 310 (thus forming one "capacitor bank" of oscillator 210), and capacitors 314f-314j may be coupled to node Y of crystal resonator 310 (thus forming the other "capacitor bank" of oscillator 210). In many instances, the capacitor banks of oscillator 210 may be substantially identical (e.g., capacitors 314a and 314f may be substantially identical, capacitors 314b and 314g may be substantially identical, capacitors 314c and 314h may be substantially identical, capacitors 314d and 314i may be substantially identical, and capacitors 314e and 314j may be substantially identical).

In each capacitor bank of oscillator 210, one or more capacitors 314 (e.g., capacitors 314a and 314f) may be coupled to a ground voltage, while others (e.g., capacitors 314b-314e and 314g-314j) may be switched capacitors coupled to a corresponding switching transistor 316 such that the non-gate terminals of the corresponding transistor 316 are respectively coupled to the corresponding capacitor 314 and a ground voltage. Each such transistor 316 may act a switch, either effectively coupling its corresponding switched capacitor 314 to ground voltage (enabling such capacitor 314), or leaving one terminal of its corresponding switched capacitor 314 floating (disabling such capacitor 314), depending on the voltage applied to the gate terminal of such transistor 316 (e.g., a "high" voltage applied to the gate terminal of transistor 316b will close the switch of transistor 316b providing a path to ground for a terminal of capacitor 314b, while a "low" voltage applied to the gate terminal of transistor 316b will open the switch of transistor 316b leaving a terminal of capacitor 314b floating). Because capacitors 314a and 314f are not switched capacitors 314, capacitors 314a and 314f may be considered as always enabled. Those of skill in the art will appreciate that the frequency of oscillation of oscillator 210 (e.g., the signal waveform characteristic seen at either of nodes X or Y) will be a function of the sum of the capacitances of the capacitors 314 that are provided a path to ground (e.g., those capacitors 314, including capacitors 314a and 314f, that are enabled). Thus, by switching transistors 316b-316e and 316g-316j, the effective capacitances of the capacitor banks may be modified, thus allowing tuning of the frequency of oscillation of oscillator 210.

As mentioned above, to permit finer granularity in the switched effective capacitance of each of the capacitor banks, one or more of the switched capacitors 314 (e.g., capacitors 314b and 314g) of each capacitor bank may be dithered—that is, periodically enabled and disabled. The effective capacitance of such dithered capacitor 314 may be approximately equal to the capacitance of the dithered capacitor 314 times the percentage of time the dithered capacitor 314 is enabled. To provide for periodicity in the enabling and disabling of dithered capacitors 314, the switching transistors 316 (e.g., transistors 316b and 316g) associated with the dithered capacitors 314 may be coupled to a delay module 324, which is in turn coupled to a delta-sigma modulator 322 of the a control module 320. Delay module 324 may be any system, device, or apparatus configured to process a signal at its input to produce one or more modified versions of the input signal at its output(s).

Based on a desired frequency of oscillation for oscillator 210, delta-sigma modulator 322 may produce a periodic signal on node O with a duty cycle appropriate to enable dithered capacitors 314 for a certain percentage of time, and disable the dithered capacitors 314 otherwise. In addition, delay module 324 may process the output signal of delta-sigma modulator 322 to produce enable signals for the dithered capacitors 314 (e.g., capacitors 314b and 314g). As described in greater detail below, delay module 324 may create enable signals such that the enable signals may be a modified form of the output of delta-sigma modulator 322, wherein such enable signals are configured to reduce or eliminate certain glitches in the output signal of oscillator 210, such as glitch 602, for example.

In addition to functionality provided by delta-sigma modulator 322, control module 320 may be configured to, based on a desired frequency of oscillation for oscillator 210, selectively enable one or more of capacitors 314c-314e and 314h-314j in order to achieve an effective capacitance that allows oscillation at the desired frequency. Accordingly, as depicted in FIG. 3, the gate terminal of certain transistors 316 (e.g., transistors 316c-316e and 316h-316j) may be coupled to a control module 320. In many instances, capacitors 314 will be enabled such that the effective capacitance of each capacitor bank is approximately equal, thus permitting the duty cycle of the output oscillation of oscillator 210 to be approximately 50%.

As mentioned above, delay module 324 may create enable signals such that the enable signals may be a modified form of the output of delta-sigma modulator 322, wherein such enable signals are configured to reduce or eliminate certain glitches in the output signal of oscillator 210, such as glitch 602, for example. The functionality of delay module 324 may be understood by reference to FIG. 4.

Figure 4:
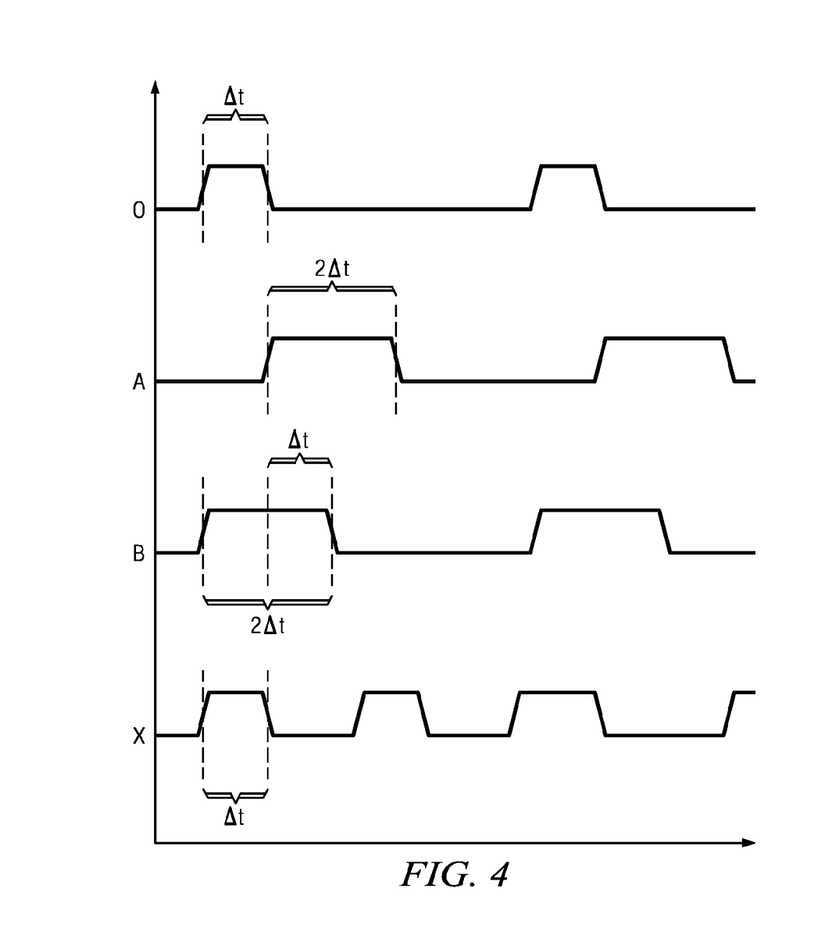
FIG. 4 illustrates a graph of example waveforms over time for selected signals at nodes of the oscillator depicted in FIG. 3, in accordance with certain embodiments of the present disclosure.

FIG. 4 illustrates graph of example waveforms over time for selected signals at nodes O, A, B, and X of oscillator 210 depicted in FIG. 3, in accordance with certain embodiments of the present disclosure. As shown in FIG. 4, delay module 324 may increase the pulse width of the input signal of node O such that the pulse widths of the signals on nodes A and B are greater than the pulse widths of the signal on node O. In some embodiments, delay module 324 may increase the pulse width by a factor of approximately two, such that the pulse widths of the enable signals on nodes A and B are approximately twice that of the signal on node O. In these and alternative embodiments, delay module 324 may also delay one of the enable signals relative to the other enable signal, such that the rise and fall of the enable signals on nodes A and B are substantially not in unison. In certain embodiments, delay module may delay one of the enable signals (e.g., node A) relative to the other (e.g., node B) by approximately 25% (e.g., approximately 90 degrees), such that the difference between the rising edges and/or falling edges of the enable signals are approximately equal to the pulse width of the input to delay module 324. Such enable signals for dithering capacitors 314 of oscillator 210 may result an oscillator output signal on node X similar to that shown in FIG. 4, with high-frequency glitches reduced or eliminated.

Modifications, additions, or omissions may be made to system 100 from the scope of the disclosure. The components of system 100 may be integrated or separated. Moreover, the operations of system 100 may be performed by more, fewer, or other components. As used in this document, "each" refers to each member of a set or each member of a subset of a set.

Although the present disclosure has been described with several embodiments, various changes and modifications may be suggested to one skilled in the art. It is intended that the present disclosure encompass such changes and modifications as fall within the scope of the appended claims.

What is claimed is:

1. A wireless communication element, comprising:
    at least one of:
        a receive path configured to receive a first wireless communication signal and convert the first wireless communication signal into a first digital signal based at least on an oscillator signal; and
        a transmit path configured to convert a second digital signal into a second wireless communication signal based at least on the oscillator signal and transmit the second wireless communication signal; and
    an oscillator configured to output the oscillator signal to at least one of the receive path and the transmit path, the oscillator comprising:
        a crystal resonator;
        an inverter coupled in parallel with the crystal resonator;
        a first switched capacitor coupled to a first terminal of the crystal resonator;
        a second switched capacitor coupled to a second terminal of the crystal resonator;
        a control module configured to output a periodic dithering signal, the periodic dithering signal having a first pulse width based on a desired frequency of oscillation for the oscillator; and
        a delay module configured to communicate a first periodic enable signal to enable the first switched capacitor and a second periodic enable signal to enable the second switched capacitor, such that:
            at least one of the first periodic enable signal and the second periodic enable signal have a second pulse width greater than the first pulse width; and
            the second periodic enable signal is phase delayed relative to the first periodic enable signal by a non-zero delay.

2. A wireless communication element according to claim 1, wherein the second pulse width is approximately two times larger than the first pulse width.

3. A wireless communication element according to claim 1, wherein the non-zero delay is approximately equal to the first pulse width.

4. A wireless communication element according to claim 1, wherein:
    the first periodic enable signal has a second pulse width greater than the first pulse width;
    the second periodic enable signal has a third pulse width greater than the first pulse width; and
    the second pulse width and the third pulse width are approximately equal.

5. A wireless communication element according to claim 1, further comprising:
    the first switched capacitor coupled to the crystal resonator via a first terminal of the first switched capacitor;
    the second switched capacitor coupled to the crystal resonator via a first terminal of the second switched capacitor;
    a first switch coupled to a second terminal of the first capacitor via a first non-gate terminal of the first switch and coupled to ground via a second non-gate terminal of the first switch;
    a second switch coupled to a second terminal of the second capacitor via a first non-gate terminal of the second switch and coupled to ground via a second non-gate terminal of the second switch; and
    the delay module coupled to a gate terminal of the first switch and to a gate terminal of the second switch such that the first periodic enable signal is communicated to the gate terminal of the first switch and the second periodic enable signal is communicated to the gate terminal of the second switch.

6. A wireless communication element according to claim 5, wherein at least one of the first switch and the second switch is a transistor.

7. A wireless communication element according to claim 1, the control module comprising a delta-sigma modulator, wherein the delta-sigma modulator is configured to output the periodic dithering signal.

8. An oscillator, comprising:
a crystal resonator;
an inverter coupled in parallel with the crystal resonator;
a first switched capacitor coupled to a first terminal of the crystal resonator;
a second switched capacitor coupled to a second terminal of the crystal resonator;
a control module configured to output a periodic dithering signal, the periodic dithering signal having a first pulse width based on a desired frequency of oscillation for the oscillator; and
a delay module configured to communicate a first periodic enable signal to enable the first switched capacitor and a second periodic enable signal to enable the second switched capacitor, such that:
  at least one of the first periodic enable signal and the second periodic enable signal have a second pulse width greater than the first pulse width; and
  the second periodic enable signal is phase delayed relative to the first periodic enable signal by a non-zero delay.

9. An oscillator according to claim 8, wherein the second pulse width is approximately two times larger than the first pulse width.

10. An oscillator according to claim 8, wherein the non-zero delay is approximately equal to the first pulse width.

11. An oscillator according to claim 8, wherein:
the first periodic enable signal has a second pulse width greater than the first pulse width;
the second periodic enable signal has a third pulse width greater than the first pulse width; and
the second pulse width and the third pulse width are approximately equal.

12. An oscillator according to claim 8, further comprising:
the first switched capacitor coupled to the crystal resonator via a first terminal of the first switched capacitor;
the second switched capacitor coupled to the crystal resonator via a first terminal of the second switched capacitor;
a first switch coupled to a second terminal of the first capacitor via a first non-gate terminal of the first switch and coupled to ground via a second non-gate terminal of the first switch;
a second switch coupled to a second terminal of the second capacitor via a first non-gate terminal of the second switch and coupled to ground via a second non-gate terminal of the second switch; and
the delay module coupled to a gate terminal of the first switch and to a gate terminal of the second switch such that the first periodic enable signal is communicated to the gate terminal of the first switch and the second periodic enable signal is communicated to the gate terminal of the second switch.

13. An oscillator according to claim 12, wherein at least one of the first switch and the second switch is a transistor.

14. An oscillator according to claim 8, the control module comprising a delta-sigma modulator, wherein the delta-sigma modulator is configured to output the periodic dithering signal.

15. A method, comprising:
providing a periodic dithering signal, the periodic dithering signal having a first pulse width based on a desired frequency of oscillation for an oscillator;
based on the periodic dithering signal, communicating a first periodic enable signal to enable a first switched capacitor and a second periodic enable signal to enable a second switched capacitor, such that:
  at least one of the first periodic enable signal and the second periodic enable signal have a second pulse width greater than the first pulse width; and
  the second periodic enable signal is phase delayed relative to the first periodic enable signal by a non-zero delay.

16. A method according to claim 15, wherein the second pulse width is approximately two times larger than the first pulse width.

17. A method according to claim 15, wherein the non-zero delay is approximately equal to the first pulse width.

18. A method according to claim 15, wherein:
the first periodic enable signal has a second pulse width greater than the first pulse width;
the second periodic enable signal has a third pulse width greater than the first pulse width; and
the second pulse width and the third pulse width are approximately equal.

* * * * *